United States Patent [19]

Gentry

[11] Patent Number: 4,644,092
[45] Date of Patent: Feb. 17, 1987

[54] SHIELDED FLEXIBLE CABLE

[75] Inventor: William G. Gentry, Winston Salem, N.C.

[73] Assignee: AMP Incorporated, Harrisburg, Pa.

[21] Appl. No.: 755,748

[22] Filed: Jul. 18, 1985

[51] Int. Cl.$^4$ .......................... H01B 7/34; H01B 7/08
[52] U.S. Cl. .................... 174/36; 174/102 C; 174/102 SC; 174/117 FF
[58] Field of Search ............... 174/36, 117 FF, 102 C, 174/102 SC, 102 R

[56] References Cited

U.S. PATENT DOCUMENTS

| Re. 31,411 | 10/1983 | Bolon et al. | 252/514 X |
|---|---|---|---|
| 1,987,508 | 1/1935 | Johns et al. | 174/102 SC |
| 3,168,617 | 2/1965 | Richter | 174/117 FF |
| 3,576,723 | 4/1971 | Angele et al. | 174/36 |
| 3,612,743 | 10/1971 | Angele | 174/36 |
| 3,715,457 | 2/1973 | Teagno et al. | 174/117 FF X |
| 3,818,117 | 6/1974 | Reyner, II et al. | 174/36 |
| 3,867,565 | 2/1975 | Prentice et al. | 174/102 SC X |
| 3,878,964 | 4/1975 | Balastee et al. | 333/84 M |
| 3,914,531 | 10/1975 | Zell et al. | 174/36 |
| 4,085,502 | 4/1978 | Ostman et al. | 174/117 FF X |
| 4,143,238 | 3/1979 | Sheth | 174/102 SC X |
| 4,209,215 | 6/1980 | Verma | 339/17 F |
| 4,300,017 | 11/1981 | Segretto et al. | 174/117 FF X |
| 4,425,263 | 1/1984 | Nazarenko | 252/514 X |
| 4,492,815 | 1/1985 | Maros | 174/36 X |
| 4,554,033 | 11/1985 | Dery et al. | 174/88 R X |

Primary Examiner—Arthur T. Grimley
Assistant Examiner—Morris H. Nimmo
Attorney, Agent, or Firm—Katherine A. Nelson

[57] ABSTRACT

A shielded multiconductor flexible cable for protection against EMI and/or RFI is disclosed. The shielded cable is comprised of a plurality of conductors disposed between two layers of insulating substrates, said cable having a graphic shield disposed on the exterior surface of at least one of the insulating substrate layers. The graphic shield is comprised of solidified conductive ink. Said ink provides an interference shield against EMI and RFI.

18 Claims, 8 Drawing Figures

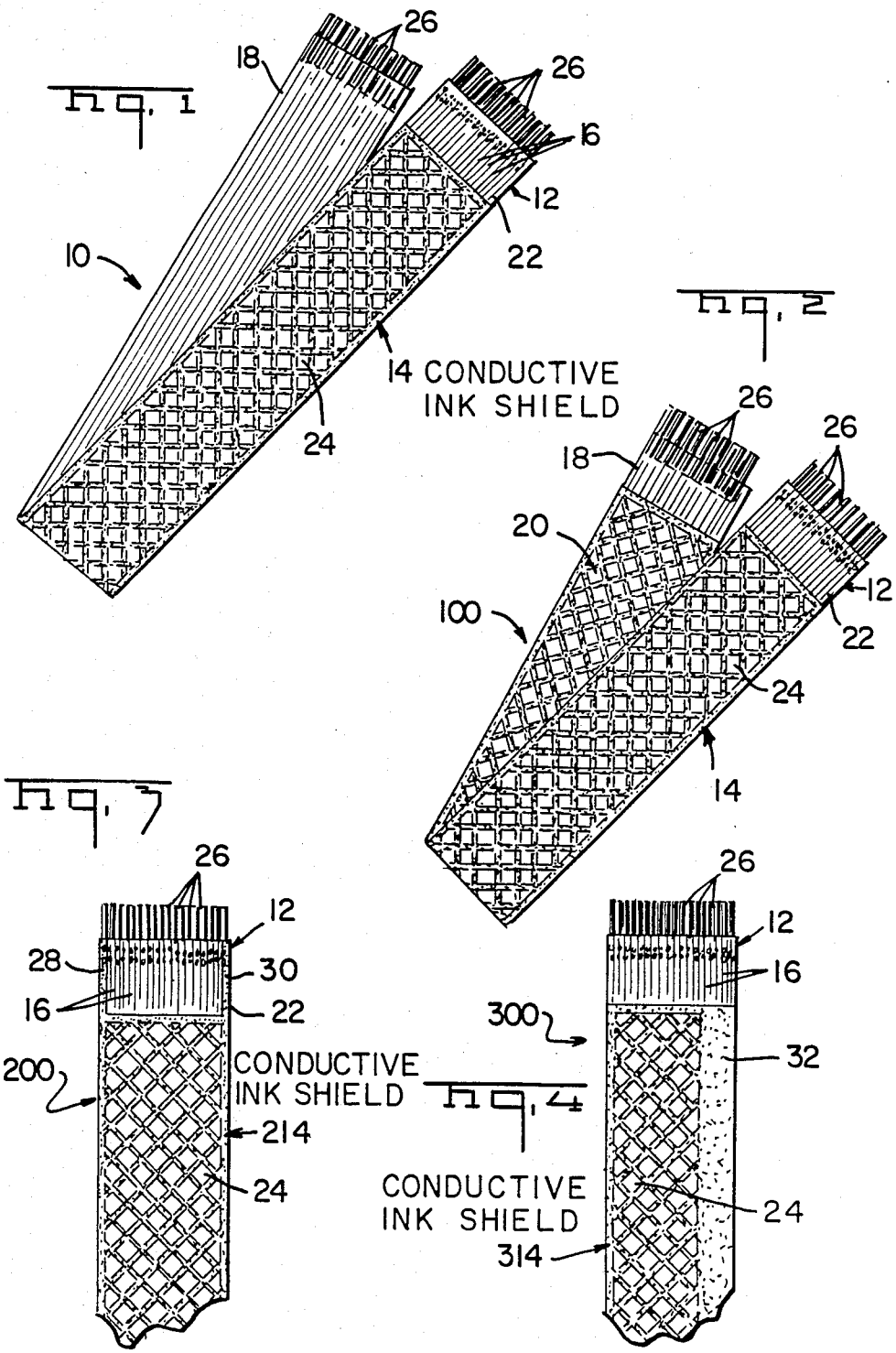

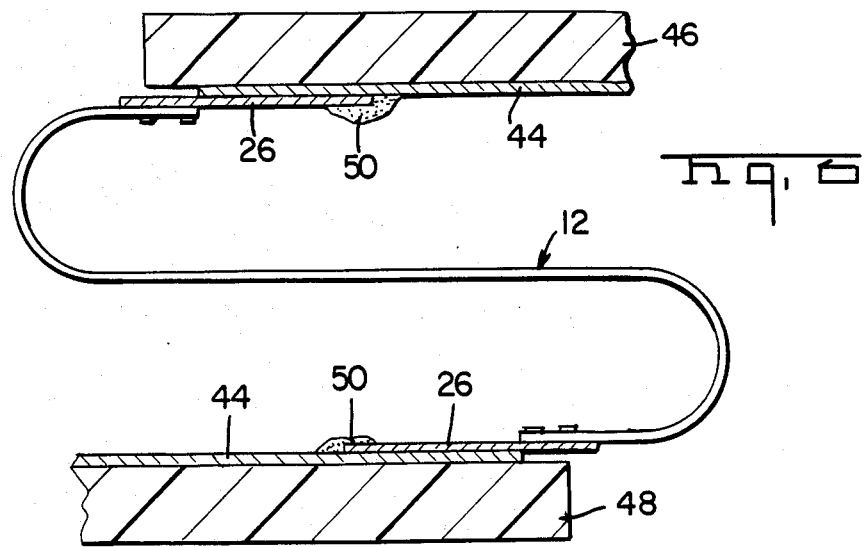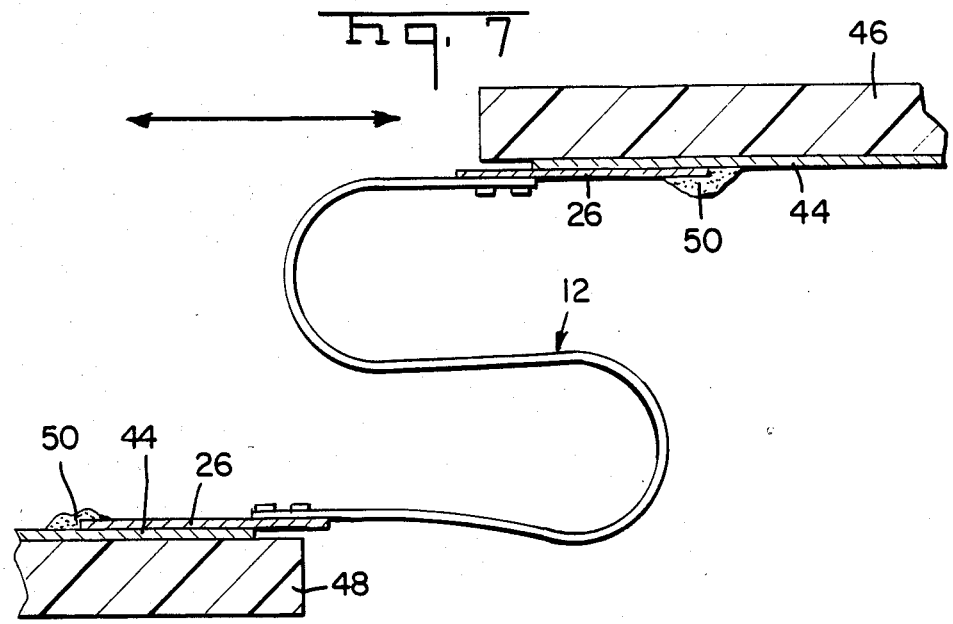

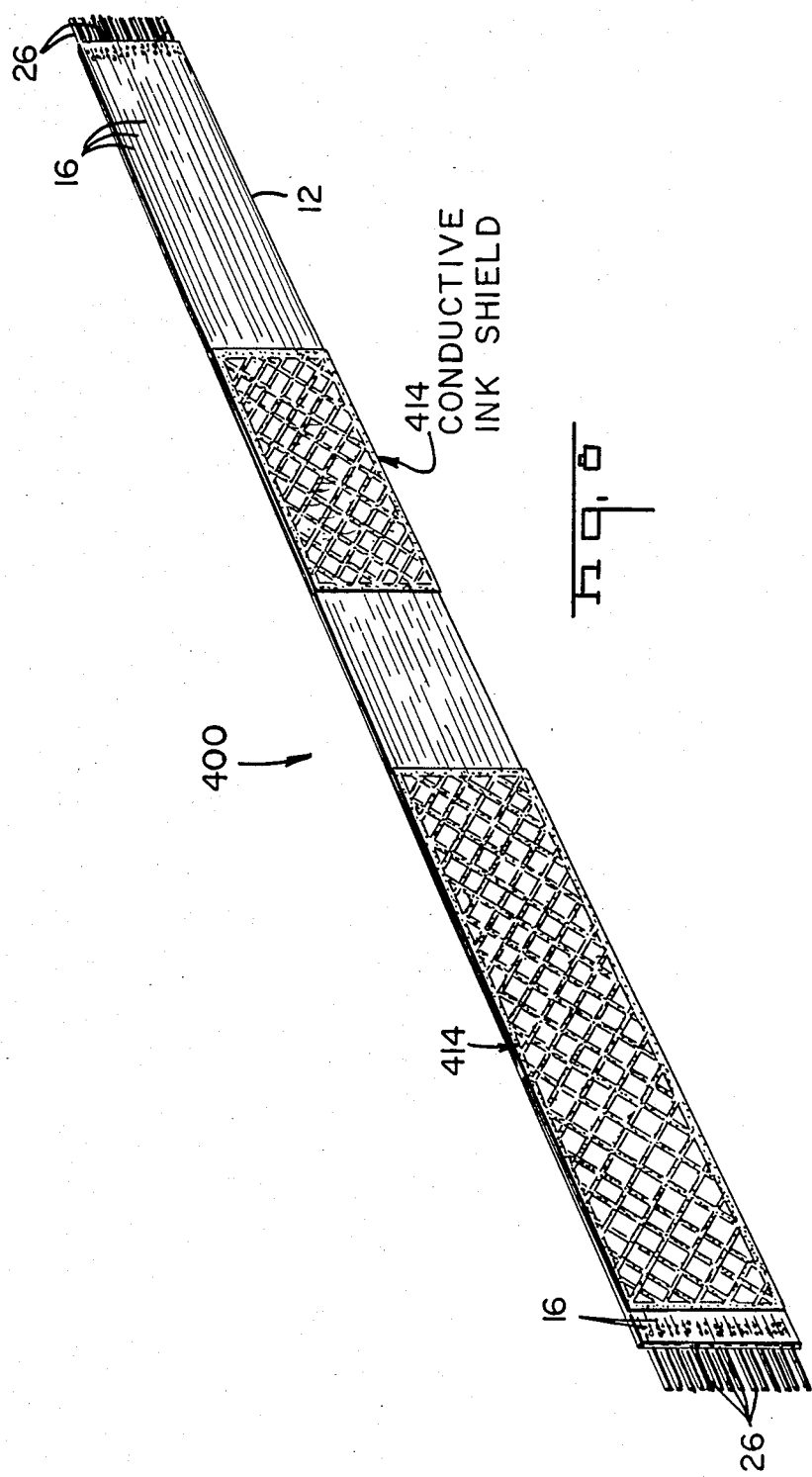

SHIELDED FLEXIBLE CABLE

FIELD OF THE INVENTION

This invention relates to flexible cables and more particularly to cables having shielding means for protection against electromagnetic interference and radio frequency interference.

BACKGROUND OF THE INVENTION

Electrical circuitry often must be protected from disruptions caused by electromagnetic interference (EMI) and radio frequency interference (RFI) entering the system. EMI energy can be generated outside of as well as inside the system and can occur anywhere in the electromagnetic spectrum. External EMI energy is an undesired conducted or radiated electrical disturbance that can interfere with the operation of electronic equipment, while internal EMI energy is the unwanted noise or unwanted interference generated by electrical or electronic circuitry within a system.

RFI is now used interchangeably with EMI but generally is limited to interference in the radio communication band. Connectors are particularly susceptible to EMI energy because of the numerous contact areas and openings for cable and external electrical contacts. The art, however, has developed sophisticated electrical connectors having substantial shielding effectiveness against EMI/RFI energy.

Often it is also desirable to have shielded cable as well as shielded connectors. In conventional flat cable applications where shielding is necessary, ribbon cable has been employed. These conventional ribbon cables may employ a metallic shield such as aluminum foil surrounded by a taped insulating jacket of polyester or the like. Other shielded ribbon cable is compressed of copper braid embedded in the insulation. An additional method of providing a sheilded cable for ribbon cable is to employ a copper braid surrounding the cable.

Although the concept of employing an aluminum foil in a polyester jacket for ribbon cable can be extended to shield flat flexible cable, flat cable shielded in this manner is significantly less flexible than unshielded flat cable and is, therefore, unsuitable for those applications where a high degree of flexibility is required.

Similarly, a copper braid can be used to form a shield surrounding flat flexible cable which can in turn be encapsulated than a polyester jacket. This form of shielded flat flexible cable, however, is even less flexible in the aluminum foil configuration. In addition to the reduction in flexibility imposed by these methods of shielding, these are fairly expensive to manufacture.

It is an object of the present invention to provide a shielded flat flexible cable that protects against EMI and RFI.

It is a further object of the invention to provide a shielded flat cable that retains the inherent flexibility of unshielded cable. In addition, it is an object of the invention to provide a shielded flat cable that is cost effective to manufacture.

SUMMARY OF THE INVENTION

The present invention is directed to a shielded multiconductor essentially flat cable comprising a plurality of conductors disposed between two layers of insulating substrates, said cable having a graphic shield disposed on the exterior surface of at least one of the insulating substrate layers. The graphic shield is comprised of solidified conductive ink, said shield providing an interference shield for EMI and RFI.

Some of the objects and advantages of the invention having been stated, others will appear as the description proceeds when taken in connection with the accompanying drawings.

BRIEF DESCRIPTION OF THE DRAWINGS

FIG. 1 is a top plan view of a flexible cable reversibly bent to show both sides of the cable, said cable having one side shielded in accordance with the invention;

FIG. 2 is a view similar to FIG. 1 with both sides of the cable shielded in accordance with the invention;

FIG. 3 is a fragmentary plan view of a cable showing an alternative embodiment of the shield;

FIG. 4 is a view similar to FIG. 3 showing a further alternative embodiment of the shield;

FIGS. 6 and 7 are fragmentary cross-sectional views of a shielded cable electrically connected to two substrates, the substrates being movable with respect to each other; and FIG. 8 is a perspective view of a cable showing a further embodiment of the shielding means.

DETAILED DESCRIPTION OF THE PREFERRED EMBODIMENT

Figure 5:
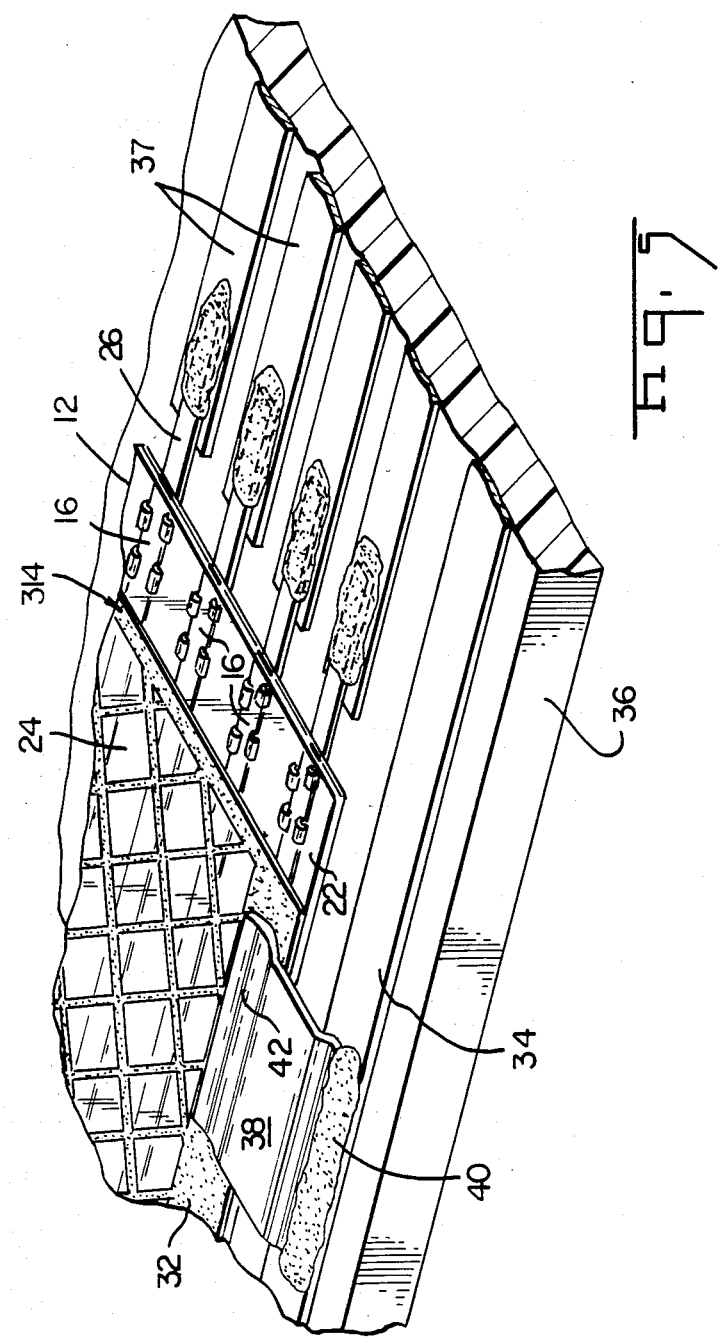
FIG. 5 is a fragmentary perspective view of the shielded cable of view 4 with the cable conductors soldered to circuit board conductors and a means for grounding the shield to a ground conductor on the board.

Referring now to FIG. 1, the shielded cable 10 is comprised of a multiconductor flat cable 12 having shielding means 14 disposed thereon. Cable 12 is comprised of a plurality of conductors 16 disposed between the interior surfaces of a first insulating substrate 18 and a second insulating substrate 22. The shielding means is comprised of a graphically formed shield disposed on the external surface 24 of the second insulating substrate 22 and extends over at least a portion of the length of the cable 12. The graphically formed shielding means 14 shown on cable 12 comprises a conductive ink screened onto the surface of the flat flexible cable. The composition of the conductive ink employed in forming the shield is conventional. The conductive ink consists of a polyester resin heavily loaded with silver flakes. Although silver conductive ink would be expected to provide sufficient shielding for RFI, satisfactory EMI shielding may require that some nickel flakes be added to the silver flakes. About ten percent nickel flakes may be added to improve EMI shielding properties of the cable. The lattice work configuration of the shielding visible on surface 24 may be altered to provide any desired level of shielding, provided of course that the shielding requirements do not exceed the inherent capacity of a conductive ink shield. In any event, the conductive ink shielding, whatever the desired pattern, would provide a significant degree of EMI/RFI shielding.

Contact members 26 are attached to the conductors 16 and the cables as is best shown in FIG. 5. For purposes of illustration the cables in FIGS. 1 through 8 are shown having solder tab contacts crimped onto the conductors of the cable. It is understood that other types of contact members may also be used. It is also to be understood that the cable conductors may be formed by discrete metal conductors or by a metal sheet which has been etched to form the desired pattern of traces by procedures well known in the art respectively, commonly known as flexible flat conductors and flexible etched conductors. Discrete wires may also be used.

The graphic shield may be applied to one exterior surface 24 as shown in cable 10 of FIG. 1 or to both exterior surfaces 24 and 20 of layers 18 and 22 respectively of cable 100 as is shown in FIG. 2. The cables 10 and 100 in FIGS. 1 and 2 illustrate floating shields, that is shields that are not attached to ground at either end of the cable. The ground may be attached anywhere along the length of the cable by a variety of means as known in the art.

FIG. 3 illustrates a cable 200 in which the shielding means 214 has two extensions 28 and 30 which extend along the side edges of one surface 24 of cable 12. The contact members 26 can be crimped through the conductive ink extensions 28, 30 and the outer conductors 16 of the cable 12. A connecting means on these outer conductors can then electrically be connecting to ground plane on a printed circuit board or other electrical component thus grounding the shield 214. It is to be understood that the shield legs may be extended to any arbitrary contact means 26 on the cable 12 thus permitting interconnection to any desired ground bus or ground contact. For example alternative rows of conductors could be attached to the conductive ink shield creating a ground signal ground configuration for the cable.

FIGS. 4 and 5 show a further alternative means for attaching a conductive ink shield 314 to a ground plane 34 on substrate 36. The conductive ink shield 314 as best seen in FIG. 4 differs from shield 14 shown in FIG. 1 in that a ground bus 32 has been defined at an arbitrary position along the length of the cable 12. FIG. 5 shows one manner of attaching the shield 314 to substrate ground bus 34. As is shown in FIG. 5, a resilient clip 38 soldered at 40 to a substrate ground bus 34 has a finger 42 which forms an adequate ground interconnection to conductive ink ground bus 32 which communicates with a patterned field of shield 314. In FIG. 5 the cable contact members 26 are in electrical engagement with corresponding conductors 37 on the substrate 36.

As is illustrated by cable 400 in FIG. 8, it is not necessary that the shielding be applied over the entire length of the flat cable 12. If EMI and RFI interference are expected to be concentrated in a specific area along the length of cable, the shielding 414 can be confined to that region only.

Shielded flexible cable having a graphically formed shield in accordance with the invention retains the inherent flexibility of the flexible cable itself. This flexibility is required for installations such as a flat flexible cable interconnection to a movable printer head as is illustrated in FIGS. 6 and 7. As is shown in FIG. 6, the flat, flexible cable 12 is electrically connected by solder to conductive pads 44 on separate printed circuit boards 46 and 48. The circuit board 46 which might be attached to a movable printer is laterally movable relative to the circuit board 48 as is shown in FIG. 7. Thus, the flat, flexible cable 12 flexes repeatedly during movement. It should be noted that any rigidity in the flat, flexible cable 12 might impose some stresses on the solder joints 50 during repeated movement between the two boards 46 and 48.

It is to be understood that soldered interconnections are used for purposes of illustration only. Other means as known in the art for interconnecting cables may also be used.

In the drawings and specification, there have been set forth preferred embodiments of the invention, and although specific terms are employed, they are used in a generic and descriptive sense only, and not for purposes of limitation.

What is claimed is:

1. A shielded multi-conductor flat flexible cable comprising:
    a plurality of conductors disposed on a first insulating substrate;
    a second insulating substrate disposed on said disposed conductors; and
    a graphic pattern disposed on the second insulating substrate over at least a portion of the length of the cable, the graphic pattern being of conductive ink and comprising means for establishing an interference shield.

2. The cable of claim 1 wherein said conductive ink comprises a resin containing conductive particles.

3. The cable of claim 1 wherein said conductive ink comprises a resin containing silver conductive particles.

4. The cable of claim 3 wherein said conductive particles include nickel particles in addition to the silver particles.

5. The flat cable of claim 1 further comprising a graphic pattern disposed on the first insulating substrate.

6. An electrically conductive multi-conductor flat cable for use in the presence of extraneous electromagnetic interference and/or radio frequency interference, comprising a plurality of flat electrical conductors disposed within insulating means covering both surfaces of the flat conductors, and a shield formed by a graphic pattern disposed over at least a portion of at least one side of the flat cable, the pattern comprising a solidified conductive ink including a resin impregnated with a plurality of conductive particles forming a conductive path in the pattern.

7. The flat cable of caim 6 wherein the conductors each comprise flat ribbons of a soft conductive material.

8. The flat cable of claim 6 wherein the conductive material comprises a soft copper.

9. The flat cable of claim 6 wherein the shield is grounded.

10. The flat cable of claim 9 wherein the shield is grounded to at least one of the flat conductors.

11. The flat cable of claim 10 further including a crimped terminal engaging a portion of the shield and one of the flat conductors and comprising means for grounding the shield.

12. The flat cable of claim 9 wherein the shield includes a ground bus.

13. The flat cable of claim 12 further comprising means engagable with the ground bus and comprising means for grounding the shield.

14. The flat cable of claim 6 wherein the conductors comprise flexible etched conductors.

15. The flat cable of claim 6 wherein the solidified conductive ink is more flexible than the flat conductors.

16. The flat cable of claim 6 wherein the flat cable comprises two insulating layers with the flat conductors laminated between the insulating layers.

17. The flat cable of claim 6 wherein the pattern is screen printable on the insulating means.

18. The flat cable of claim 6 further comprising a graphic pattern disposed on the first insulating substrate.

* * * * *